US012761285B1

(12) United States Patent
Kamath et al.

(10) Patent No.: US 12,761,285 B1
(45) Date of Patent: Oct. 13, 2026

(54) METHOD FOR ENABLING EFFICIENT AND TRUSTWORTHY REMAINING USEFUL LIFE (RUL) ESTIMATION OF ELECTRIC VEHICLE BATTERIES FOR SECOND LIFE APPLICATIONS

(71) Applicant: Analog Devices International Unlimited Company, Limerick (IE)

(72) Inventors: Narsimh Dilip Kamath, Bangalore (IN); Jonathan Noah Simon, Castro Valley, CA (US)

(73) Assignee: Analog Devices International Unlimited Company, Limerick (IE)

( * ) Notice: Subject to any disclaimer, the term of this patent is extended or adjusted under 35 U.S.C. 154(b) by 591 days.

(21) Appl. No.: 17/575,587

(22) Filed: Jan. 13, 2022

Related U.S. Application Data

(60) Provisional application No. 63/137,715, filed on Jan. 14, 2021.

(51) Int. Cl.
*G01R 31/392* (2019.01)
*G01R 31/367* (2019.01)
*G01R 31/396* (2019.01)

(52) U.S. Cl.
CPC ......... *G01R 31/392* (2019.01); *G01R 31/367* (2019.01); *G01R 31/396* (2019.01)

(58) Field of Classification Search
CPC ... G01R 31/392; G01R 31/396; G01R 31/367
See application file for complete search history.

(56) References Cited

U.S. PATENT DOCUMENTS

| | | | | |
|---|---|---|---|---|
| 6,252,380 | B1 | 6/2001 | Koenck | |
| 7,521,935 | B2 | 4/2009 | Uchida | |
| 7,928,735 | B2 | 4/2011 | Huang et al. | |
| 8,035,395 | B2 | 10/2011 | Suzuki et al. | |
| 9,395,417 | B2 | 7/2016 | Song | |
| 10,001,528 | B1 | 6/2018 | Matsuyama et al. | |
| 10,209,314 | B2 | 2/2019 | Garcia et al. | |
| 10,401,433 | B2 | 9/2019 | Chow et al. | |
| 10,424,961 | B1 * | 9/2019 | Maluf | H02J 7/485 |
| 2005/0017685 | A1 | 1/2005 | Rees et al. | |
| 2011/0082621 | A1 | 4/2011 | Berkobin et al. | |
| 2015/0046109 | A1 | 2/2015 | Miwa et al. | |
| 2016/0171794 | A1 * | 6/2016 | Brochhaus | H01M 10/425 701/31.7 |

(Continued)

FOREIGN PATENT DOCUMENTS

| | | | |
|---|---|---|---|
| CN | 104900925 B | | 10/2017 |
| CN | 109919634 A | * | 6/2019 |

(Continued)

*Primary Examiner* — Shelby A Turner
*Assistant Examiner* — Xiuqin Sun
(74) *Attorney, Agent, or Firm* — Schwegman Lundberg & Woessner, P.A.

(57) ABSTRACT

System and methods for determining the remaining useful life of a battery are described. The remaining useful life is determined in some instances by storing on the battery data indicative of an operating history of the battery, wherein data for each battery cycle is stored using a fixed allocation of memory. The data indicative of an operating history of the battery is accessed via the battery, and a remaining useful life is computed from the accessed data.

20 Claims, 6 Drawing Sheets

(56) References Cited

U.S. PATENT DOCUMENTS

| | | | | |
|---|---|---|---|---|
| 2018/0323478 | A1 * | 11/2018 | Paulsen | H01M 10/0525 |
| 2019/0033381 | A1 | 1/2019 | Karner et al. | |
| 2019/0176639 | A1 | 6/2019 | Kumar et al. | |
| 2019/0285703 | A1 * | 9/2019 | Juva | H02J 7/00047 |
| 2019/0329669 | A1 * | 10/2019 | Soeda | B60L 50/60 |
| 2019/0353709 | A1 | 11/2019 | Kaisers | |
| 2019/0353711 | A1 | 11/2019 | Paulose | |
| 2020/0014238 | A1 * | 1/2020 | Daniels | H02J 9/062 |
| 2020/0055421 | A1 | 2/2020 | Sastinsky | |
| 2021/0091436 | A1 * | 3/2021 | Haring | H01M 50/258 |
| 2022/0060332 | A1 * | 2/2022 | Liu | H04L 9/3236 |
| 2022/0082627 | A1 * | 3/2022 | O'Mahony | H01M 10/4221 |

FOREIGN PATENT DOCUMENTS

| | | | | | |
|---|---|---|---|---|---|
| CN | 111157897 | A | | 5/2020 | |
| CN | 111999648 | A | * | 11/2020 | G01R 31/3648 |
| CN | 212302539 | U | * | 1/2021 | |
| EP | 3686614 | A1 | | 7/2020 | |
| WO | WO-2020025943 | A1 | * | 2/2020 | H04Q 9/00 |
| WO | WO 2020/179120 | A1 | | 9/2020 | |

* cited by examiner

400

| Column / Row | 1 | 2 | 3 | 4 |
|---|---|---|---|---|
| 1 | Parameter | Bit Width | Record #n | Record #n+1 |
| 2 | Cycle | 1 B | Discharge | Charge |
| 3 | Cycle # | 2 B | #1 | #2 |
| 4 | Timestamp – Start | 4 B | 20 Aug 2020, 07:30 | 21 Aug 2020, 15:30 |
| 5 | Timestamp – End | 4 B | 20 Aug 2020, 08:00 | 21 Aug 2020, 16:15 |
| 6 | Max Cell Voltages [1:12] | 24 B | [4.1 V, 4.0 V, ... , 4.2 V] | [4.0 V, 3.9 V, ... , 4.1 V] |
| 7 | Min Cell Voltages [1:12] | 24 B | [3.5 V, 3.6 V, ... , 3.7 V] | [3.8 V, 3.7 V, ... , 3.9 V] |
| 8 | Max Temp | 24 B | [32 C, 34 C, ... , 33 C] | [32 C, 34 C, ... , 33 C] |
| 9 | Min Temp | 24 B | [22 C, 23 C, ..., 25 C] | [28 C, 29 C, ... , 27 C] |
| 10 | Crypto HASH | 32 B | | |
| 11 | Total | 140 B | | |

FIG. 4

METHOD FOR ENABLING EFFICIENT AND TRUSTWORTHY REMAINING USEFUL LIFE (RUL) ESTIMATION OF ELECTRIC VEHICLE BATTERIES FOR SECOND LIFE APPLICATIONS

CROSS-REFERENCE TO RELATED APPLICATIONS

This application claims the benefit under 35 U.S.C. § 119(e) of U.S. Provisional Patent Application Ser. No. 63/137,715, filed on Jan. 14, 2021, and entitled "A METHOD FOR ENABLING EFFICIENT AND TRUSTWORTHY REMAINING USEFUL LIFE (RUL) ESTIMATION OF ELECTRIC VEHICLE BATTERIES FOR SECOND LIFE APPLICATIONS," which is hereby incorporated by reference herein in its entirety.

FIELD OF THE DISCLOSURE

This application relates to determining the state of health of a battery.

BACKGROUND

A battery is sometimes characterized by its state of health, which is one indicator of its anticipated service lifetime.

SUMMARY OF THE DISCLOSURE

Systems and methods for determining the remaining useful life of a battery are described. The remaining useful life is determined in some instances by storing battery data indicative of an operating history of the battery on the battery such that the battery data may be accessed via the battery and used to compute the remaining useful life. In some situations, the battery data may be stored in a cryptographically secure manner, to preserve the integrity of the stored data and to produce more reliable remaining useful life estimates.

Some embodiments are directed to a method of predicting remaining useful life of a battery. The method may comprise, storing on the battery data indicative of an operating history of the battery, wherein the data for each battery cycle is stored using a fixed allocation of memory; accessing the data via the battery; and computing a remaining useful life from the accessed data.

Some embodiments are direct to a method of transmitting remaining useful life data for cryptographic validation. The method may comprise, processing raw data, measured during operation of a battery, to generate data indicative of the operating conditions of the battery, wherein the data for each battery cycle is stored using a fixed allocation of memory; generating a cryptographic hash based at least in part on the data; and transmitting pre-validation data using a battery monitoring unit attached to the battery.

Some embodiments are direct to a method of validating pre-validation data. The method may comprise, receiving, at a validation node, the pre-validation data of a fixed allocation of memory based at least in part on data that is indicative of the operating conditions of a first battery; validating the pre-validation data to generate a validated data block; upon validation of a data block, generating a blockchain that includes the validated data block; and transmitting the blockchain to nodes of the distributed ledger.

BRIEF DESCRIPTION OF THE FIGURES

Various aspects and embodiments of the application will be described with reference to the following figures. It should be appreciated that the figures are not necessarily drawn to scale. Items appearing in multiple figures are indicated by the same reference number in all the figures in which they appear.

FIG. 4 illustrates an example table of block data, in accordance with some embodiments described herein.

DETAILED DESCRIPTION

Figure 1:
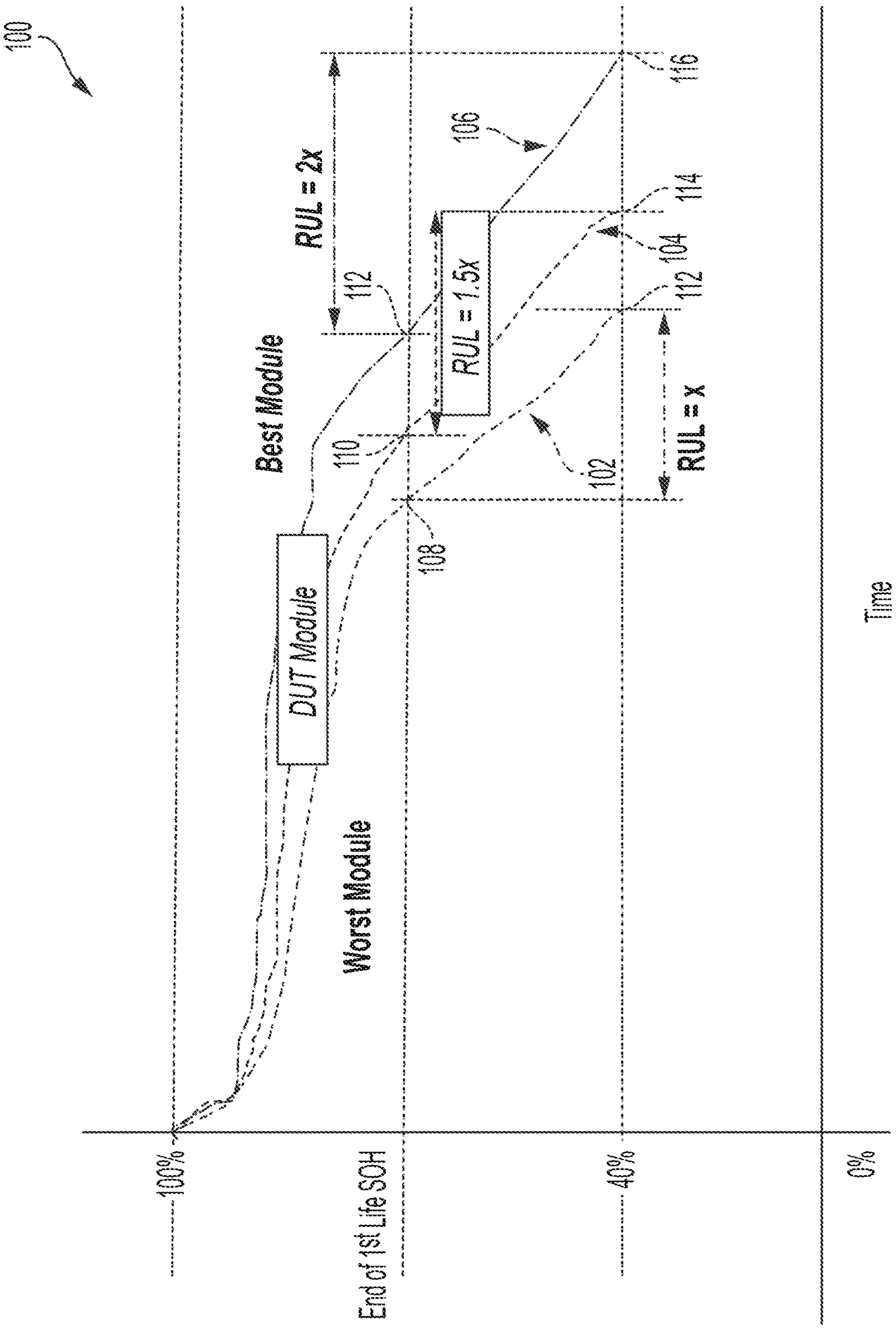
FIG. 1 illustrates the change in state of health over time of batteries across their first and second life applications.

Aspects of the present application relate to predicting the remaining useful life (RUL) of a battery. In some aspects, potential second life applications of the battery are assessed based on the predicted remaining useful life. According to an aspect of the present application, battery operation data is processed locally (at the battery, at the "edge") to determine parameters relevant to predicting remaining useful life or second life, and those parameters are stored locally (at the battery) in a cryptographically secure manner.

It is beneficial to be able to predict the remaining useful life of a battery. Batteries are of increasing importance in society and finding increasing usage in various applications, such as in electric vehicles. The useful life may depend on the particular application in which the battery is used. For example, a given battery may have a limited remaining useful life in one application, but a longer remaining useful life in a different application. In some situations, a battery is initially deployed in one application—sometimes referred to as the battery's "first life"—and, after its remaining useful life in that application diminishes beyond a desirable amount, is then deployed in a second application—sometimes referred to as the battery's "second life"—for which the battery still has a satisfactory remaining useful life. Therefore, being able to predict the remaining useful life of the battery may facilitate deployment of the battery in an appropriate application.

The remaining useful life of a battery depends on the state of health of the battery in at least some embodiments, which in turn depends on the battery's weight and capacity for at least some types of batteries. Increasing the capacity of a battery generally involves increasing the weight of the battery. Therefore, selecting the appropriate battery for a given application may involve balancing the weight of the battery with the appropriate capacity to provide sufficient power for operation. For mobile applications, such as for batteries in electric cars, the weight to capacity ratio of the battery may be a priority in choosing the appropriate battery. However, the capacity of the battery decreases throughout its operational life. Therefore, in applications where the weight to capacity ratio is a priority, the useful life of a battery may be limited to when the capacity is above a threshold value. The capacity of a battery may be quantified by the state of health. The state of health is the percentage of the maximum available charge of the battery relative to the maximum charge at the time of manufacturing. For example, a battery in an electric vehicle may be useful when the battery's state of health is greater than or equal to 60%. Thus, the end of the first life, as a battery in an electric vehicle, may occur when the state of health drops to less than or equal to 60% for that type of battery.

At the end of the useful operational time of the battery it may be unsuitable for continued use in its first life application. However, other applications may have different weight to capacity requirements or may be relatively indifferent to the weight of the battery. Stationary applications are examples of such applications. For example, backup energy facilities and renewable energy installations may use batteries to store excess power either to locally supply power or to supplement power supply to a residential and/or commercial grid. Therefore, batteries at the end of their first life may be repurposed for second life applications. Second life battery applications may provide economic and environmental benefits by extending the operational life of batteries and by reducing the waste produced by disposing of and manufacturing new batteries that would occur absent repurposing. Accurately assessing the remaining useful life can facilitate better selection of the second life of the battery and can positively impact pricing of batteries.

The inventors have recognized and appreciated that transitioning batteries from first life to second life applications presents challenges, because the remaining useful life of a battery is dependent on the historical behavior of the battery, and not simply the state of health of the battery at a particular moment in time. Therefore, based on the use conditions of the battery during its first life, the remaining useful life of the battery, for second life applications, may be highly variable from battery to battery. The remaining useful life of a battery is the time for a battery's capacity to reduce to a level unsuitable for its prescribed application. For example, depending on the chemistry of the battery, the decrease in capacity of a battery during its first life may occur by various physical and/or chemical processes. In either case, batteries that have been in use for longer periods of time, subjected to more power intensive use conditions, and/or operated at more extreme temperatures may experience a faster loss of capacity relative to batteries that are operated under ideal conditions. The battery-to-battery variation in remaining useful life may pose challenges in determining which batteries are suitable for particular second life applications and may provide challenges in accurately evaluating the battery.

The inventors have further recognized and appreciated that determining the remaining useful life at the end of the batteries first life provides challenges. Traditionally, prediction of the remaining useful life of a battery required subjecting the battery to testing cycles performed by expensive and bulky test equipment. Even then, the predictions suffered from inherent limitations of such testing. For example, testing cycles measure the change in capacity over multiple charge/discharge cycles to determine the remaining useful life. The accuracy of testing cycles depends on the number of cycles. Therefore, to determine an accurate estimation of the remaining useful life, many discharge cycles of the battery may be required. Testing cycle processes may be expensive and time consuming and may further decrease useful capacity of the battery.

An alternative to charge cycling is to measure the operating conditions of the battery while in use and to document the historical operating conditions. From the historical operating conditions, the remaining useful life may be determined. The inventors have recognized and appreciated that a challenge of determining the remaining useful life from the historical operating conditions of the battery is establishing trust that the recorded historical operation conditions are accurate. Thus, according to aspects of the present application, data on the operating conditions is encrypted in a cryptographically secure manner, such that the remaining useful life may be reliably determined and fraud in the selling of used batteries for second life applications will be suppressed.

However, encrypting data in a cryptographically secure manner may be computationally expensive. Continuous data collection and encryption may consume large memory, power, and processing resources. By contrast, infrequent data collection and encryption may fail to capture enough information to accurately determine the remaining useful life. According to an aspect of the present application, raw data collected at the battery is processed to determine a plurality of parameters which may be used to predict the second life of the battery, and those parameters are stored locally on the battery in an encrypted form. In some embodiments, the calculated parameters include one or more of: cycle, cycle number, timestamp beginning, timestamp end, maximum cell voltages, minimum cell voltages, maximum temperature, and minimum temperature. A hash may also be calculated and stored. Predicting second life can be done using various algorithms which use one or more of the listed parameters.

Storing the calculated parameters locally at the battery—at the edge—ensures that the data remains with the battery, and thus is accessible to the entity that has the battery. In this manner, an entity attempting to assess the remaining useful life of a battery need not contact a third party for permission to access data about the first life of the battery, but rather can access the data directly from the battery itself.

In some embodiments, the data stored locally on the battery is less than the raw data collected. Processed data representing the parameters described above are sufficient in at least some embodiments to predict remaining useful life from selection of a suitable algorithm. Thus, instead of storing raw battery data on the battery, which may be computationally and storage-wise burdensome, the raw data may be processed to produce the relatively smaller amount of data representing the desired parameters. That data may be stored and later accessed by an entity possessing the battery and operating a suitable algorithm to use such data to predict the remaining useful life.

Further still, in some embodiments, the data stored locally at the battery is stored in a cryptographically secure manner, so the entity using the data to predict remaining useful life can trust the data.

In summary, according to some aspects of the present application, battery data is collected, processed and stored locally. The data may be processed to determine parameters useful to predicting the remaining useful life of the battery. The data may be stored in a secure manner. An entity may acquire the battery and make an assessment of the remaining useful life of the battery using the locally stored data.

Aspects of the present application provide a method for efficient and trustworthy estimation of remaining useful life of a battery.

According to an aspect of the present application, a cell monitoring unit is added to the battery module at the start of its first life (use in electric vehicle). The cell monitoring unit periodically measures battery parameters such as cell voltages and temperatures. Software running on the cell monitoring unit performs edge processing of the battery parameters in order to determine useful data records of first life usage. The first life data records are cryptographically tied together to construct a blockchain that is occasionally signed by the device private key. The signed blockchain is stored in local memory—thereby binding to the battery module, a permanent, largely immutable, and traceable record of first life usage history. This record can later be extracted from the cell monitoring unit and used offline—for example, in an ECU or on the Cloud—in order to more accurately determine the Remaining Useful Life (RUL) of the battery at the end of first life when the battery is sold for use in second life applications.

A cell monitoring unit may be used to monitor the historic operating conditions of the battery to determine the differences in RUL. Based on the historic operating conditions of the battery, the capacity of the battery may decrease at an average rate, resulting in an average remaining useful life. Some battery capacities may degrade more slowly, resulting in an above average remaining useful life while other battery capacities may degrade more quickly, resulting in below average remaining useful life. The differences in the rate of capacity degradation may be compared by plotting the change in the state of health over time.

FIG. 1 illustrates the change in state of health over time of batteries across their first and second life applications. Graph 100 illustrates state of health as a function of time for three different battery modules. Curve 102 represents the change in state of health for a below average battery module, curve 104 represents the change in state of health of an average battery module, and curve 106 represents the change in state of health for an above average battery module. Each of the curves begin the operational lifetime with state of health 100%. In the illustrated embodiments, the end of first life is set to be at a state of health of approximately 75%. During the operational lifetime of the below average battery, the state of health decreases faster, as shown by curve 102, relative to the average and above average batteries, as shown by curve 104 and 106 respectively. As a result, the below average battery reaches its end of first life level first at point 108, followed by the average battery which reaches its end of first life at point 110, and the above-average battery which reaches its end of life last at point 112.

As illustrated in the example in FIG. 1, the battery's second life begins when the battery is transitioned from its first life application at approximately a 75% state of health until approximately a 40% state of health where the battery may be retired for disposal or recycling. Based on the rate of degradation of the battery, different batteries may be suitable for different second life applications and/or may valuated based on how long the battery is expected to remain useful in its second life. For example, the above average battery may be worth more as it may operate for longer in its second life before needing to be replaced, relative to the below average battery. As another example, the above average battery may be used in second life applications which require increased RUL. For applications which require less RUL a below average battery may be used. As shown in FIG. 1, the average battery operates for 1.5 times longer than the below average battery in its second life, and the above average battery operates for 2.0 times longer than the below average battery in its second life.

The inventors have recognized that due to the differences in value of batteries at the end of their first life, it may be advantageous to determine the remaining useful life of the battery prior to installing the battery in a second life application. Therefore, the inventors have developed an RUL system that may be installed in an electric vehicle that includes a battery and a cell monitoring unit. The battery may be configured to provide power, or a portion of the power, used to operate an electric vehicle, and the cell monitoring unit may determine an estimate of the remaining useful life of the battery.

Figure 2:
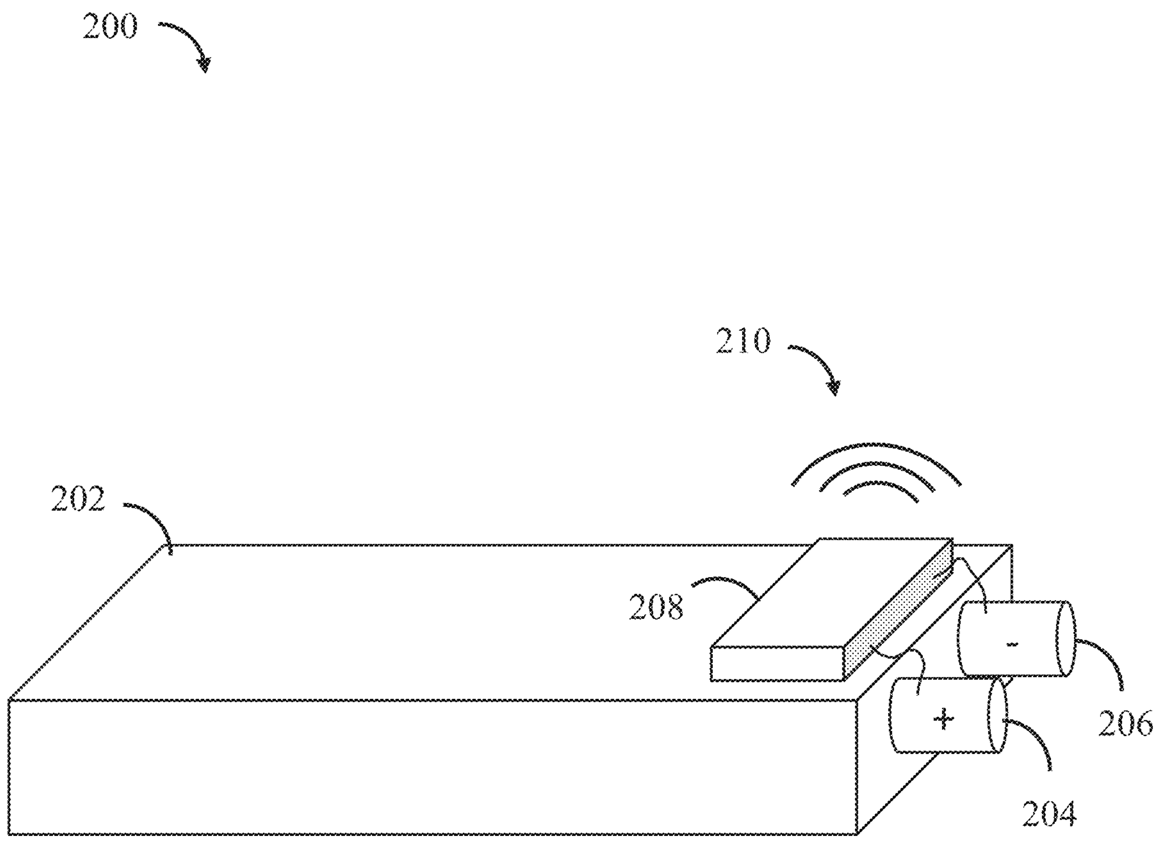
FIG. 2 illustrates a schematic of an example remaining useful life (RUL) system 200, in accordance with some embodiments described herein.

FIG. 2 illustrates a schematic of an exemplary RUL system 200, in accordance with some embodiments. RUL system 200 includes battery 202 with positive and negative leads 204 and 206 respectfully. A cell monitoring unit 208 is integrated with battery 202 and is configured to monitor the conditions of the battery during use. In some embodiments, cell monitoring unit 208 may be configured to measure voltage, status, temperature, time, and may be further configured with network connectivity.

In some embodiments, cell monitoring unit 208 may be configured to measure an output voltage at electrodes 204 and 206 of the battery during use. To measure the output voltage at electrodes 204 and 206, the cell monitoring unit may include electrical leads integrated with the housing and configured as a voltmeter. Additionally, or alternatively, the output current and/or impedance of the battery may also be measured during use.

The cell monitoring unit 208 may include a thermometer to measure the temperature during operation of the battery. In some embodiments, the thermometer may be configured within the cell monitoring unit 208 and may measure and record the temperature of the unit. In such embodiments, the thermometer may be located near a surface in contact with the battery. Additionally, or alternatively, the thermometer may be located near a surface not in contact with the battery to measure an ambient temperature. As another example, cell monitoring unit 208 may include a thermocouple that is configured to probe the temperature on the surface of, or internal to, battery 202.

In some embodiments, where battery 202 includes multiple battery cells within a single battery module, the cell monitoring unit may be configured to measure the collective output voltage of the cells and/or the output voltages of each individual cell.

Cell monitoring unit 208 may be configured to determine a status of the battery. For example, the cell monitoring unit may be configured to determine if the battery is being charged or discharged. In some embodiments, the status may be determined based on the sign of the voltage measured at the terminals of the battery.

The cell monitoring unit 208 may be further configured to track the cycle number of the battery. For example, at the beginning of a charging and/or discharging cycle the cycle number may be incrementally increased to reflect the beginning of the next cycle.

In some embodiments, cell monitoring unit 208 may record time stamps associated with the measurements of the battery during use. For example, cell monitoring unit 208 may include an internal clock for monitoring the time associated with the measurements of the battery during use. As another example, the cell monitoring unit 208 may receive information about the current time from a network communicatively coupled to the cell monitoring unit.

Cell monitoring unit 208 may include networking components for transmitting and/or receiving signals 210 with a network. In some embodiments, the networking components may be configured to wirelessly communicate with a network. For example, the networking components may wirelessly communicate over a 5G data network in accordance with 3GPP protocols.

Additionally, or alternatively, the networking components may wirelessly communicate over Wi-Fi networks, in accordance with some embodiments. For example, Wi-Fi communication may be implemented according to 802.11 protocols. Other wired or wireless networking protocols may also be used as aspects of the technology described herein are not limited in this respect.

In some embodiments, cell monitoring unit 208 may be configured to calculate parameters from the measured data. For example, the calculated parameters include one or more of: cycle, cycle number, timestamp beginning, timestamp end, maximum cell voltages, minimum cell voltages, maximum temperature, and minimum temperature. These calculated parameters may be calculated from the raw data collected by cell monitoring unit. Once calculated, the parameters may be stored in on the cell monitoring unit.

The calculated parameters determined by cell monitoring unit 202 may be stored in a cryptographically secure manner. In some embodiments, the measurements made by cell monitoring unit 202 may be transmitted through the network interface for encrypting in a distributed ledger. For example, the calculated parameters may be stored in a blockchain.

In some embodiments, the calculated parameters determined by cell monitoring unit 202 may be stored in a blockchain. The blockchain may be stored in a distributed ledger by the nodes associated with the distributed ledger. A node associated with the distributed ledger may be a computing device that stores at least a portion of the distributed ledger. In some embodiments, the nodes of the network include cell monitoring units that are integrated with the battery. In some embodiments, nodes of the distributed ledger may include computing nodes separate from a battery. For example, a computing device may be operated as a node of the distributed ledger by battery manufactures, battery retailers, and/or 3rd parties.

Figure 3A:
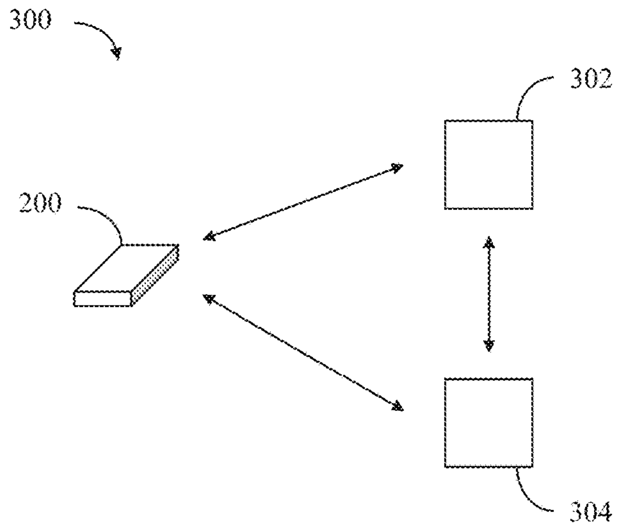
FIG. 3A illustrates an example network between nodes of the distributed ledger, in accordance with some embodiments described herein.

FIG. 3A illustrates an example network between nodes of the distributed ledger, in accordance with some embodiments. As shown in FIG. 3A, each of the nodes in the network communicate with another node. Battery 200, which includes a battery monitoring unit, may communicate with nodes 302 and 304. Nodes 302 and 304 may communicate with each other. In some embodiments, each of the nodes may store a complete copy of the blockchain. Additionally, or alternatively, each of the nodes may store a partial copy of the blockchain.

In some embodiments, nodes may be dedicated as transaction nodes, and/or validating nodes. Transaction nodes may generate pre-validation data for new blocks to be added to the blockchain. For example, transaction nodes may process the raw battery data to generate processed data that is transmitted as pre-validation data to be validated and added to the blockchain by the validation nodes.

Validating nodes may validate the pre-validation data generated and generated the signed blocks for appending onto the blockchain. Validating nodes may check that the formatting and/or content of the pre-validation data conforms with the protocols of the blockchain. For example, validation may check the size, ranges, completeness, source, and/or timing of the pre-validation data. In other embodiments, validation may use a set of rules to determine that the block conforms with the protocols of the blockchain.

The validating nodes may also generate the signed blocks for appending onto the blockchain. To add a block to the blockchain, the validating nodes may use a consensus process to determine when a validated block is added to the blockchain. A proof of work or a proof of stake process may be used to determine when a validated block is added to the blockchain. In other embodiments, other consensus process may be used, as aspects of the technology described herein are not limited in this respect.

In some embodiments, the validation node may use a proof of work processes to determine which validated blocks are added to the chain. In the proof of work process, the validation node may attempt to solve calculations in accordance with the protocols of the blockchain. For example, the validation node may generate a cryptographic hash based on the data to be stored on the blockchain and the protocols of the blockchain.

In some embodiments, the validation node may use a proof of stake processes to determine which validated blocks are added to the chain. In the proof of stake process, the validation node may provide evidence of transactions that have either originated from or have been stored on the validation node. The transactions may include data collected from a battery monitoring unit, as described herein.

In some embodiments, the cell monitoring unit may be a both a transaction node and a validation node. Additional computing nodes that are located separately from a battery may be designated as validation nodes. In other embodiments, the cell monitoring unit may only be a transaction node and the all the validation nodes may be separate computing nodes. In yet other embodiments, nodes of the distributed ledger may be limited to cell monitoring units.

Figure 3B:
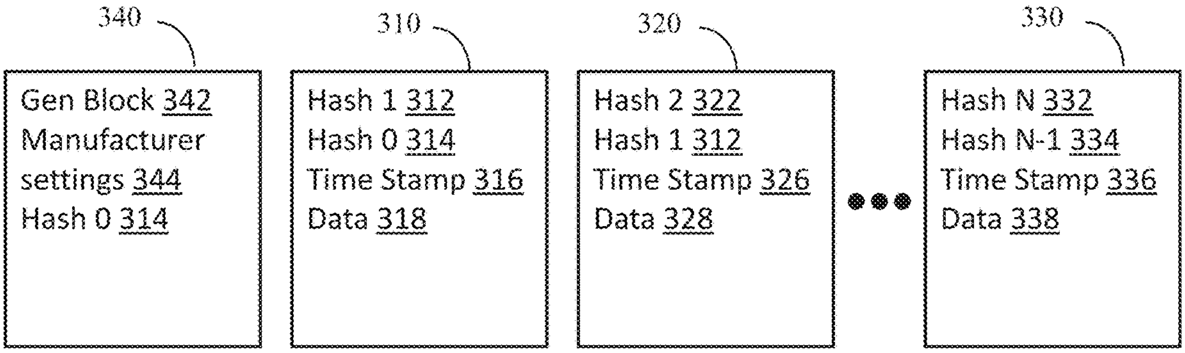
FIG. 3B illustrates an example diagram of a blockchain, in accordance with some embodiments described herein.

FIG. 3B illustrates an exemplary diagram of a blockchain, in accordance with some embodiments. In some embodiments, individual blocks may include a hash generated for the present block, a hash from the previous block, a time stamp, and a data block. In some embodiments, each block may correspond to the processed data from a single battery cycle. In this way, each of n battery cycles during the battery's first and/or second life may be stored in at least n-blocks.

As illustrated in FIG. 3B, a first set of battery cycle data may be stored in a first block 310. Block 310 may include a first hash 312 generated in the cryptographic formation of the block. A hash referencing a previous block of the chain, for example hash 314, referencing a genesis block 340. A time stamp 316 indicating a formation time of block 310 and including battery cycle data 318. A second block 320 includes a second set of battery cycle data. Block 320 includes a second hash 322, a reference to a previous hash 312, a time stamp 326, and battery cycle data 328. The blockchain may include n blocks. An $n^{th}$ block 330 may include an $n^{th}$ hash, an $n-1^{th}$ hash, time stamp 336, and battery cycle data 338.

In some embodiments, hash numbers may be generated algorithmically. In some embodiments, hash numbers may be generated based at least in part on the data to be stored in a block with the hash.

In some embodiments, the blocks may be generated with a different format that includes the data to be stored within the block, as aspects of the technology described herein is not limited in this respect.

In some embodiments, a genesis block, being the first block of a blockchain, may be generated following installation of the battery monitoring unit into the battery. The genesis block may include battery identification information stored within the block. For example, the genesis block may include a manufactures number for the battery. Additionally, or alternatively, other data such as date of installation, battery identification, and/or quality control data associated with the manufacturing process of the battery may be included in the genesis block as aspects of the technology described herein are not limited in this respect.

According to some aspects of the technology described herein, grouping data by charging cycle may provide advantages for determining a remaining useful life of the battery. For example, the sequence of battery cycles and the measured parameters of battery usage which correspond to each battery cycle may be preserved when data is grouped by cycle. Estimates of the remaining useful life may depend on the temperature, voltage, and on whether the battery is being charged or discharged. Additionally, the history of battery use conditions may impact how further use impacts battery degradation. Therefore, according to some aspects of the technology described herein, accurate predictions of the remaining useful life may depend both on the number of times the battery was operated under certain conditions (e.g., extreme temperatures) as well as depending on the specific sequence of conditions under which the battery is operated. Therefore, the inventors have developed a method of determining the remaining useful life of the battery that includes processed data grouped according to battery cycle and stored in a cryptographically secure manner.

Figure 3C:
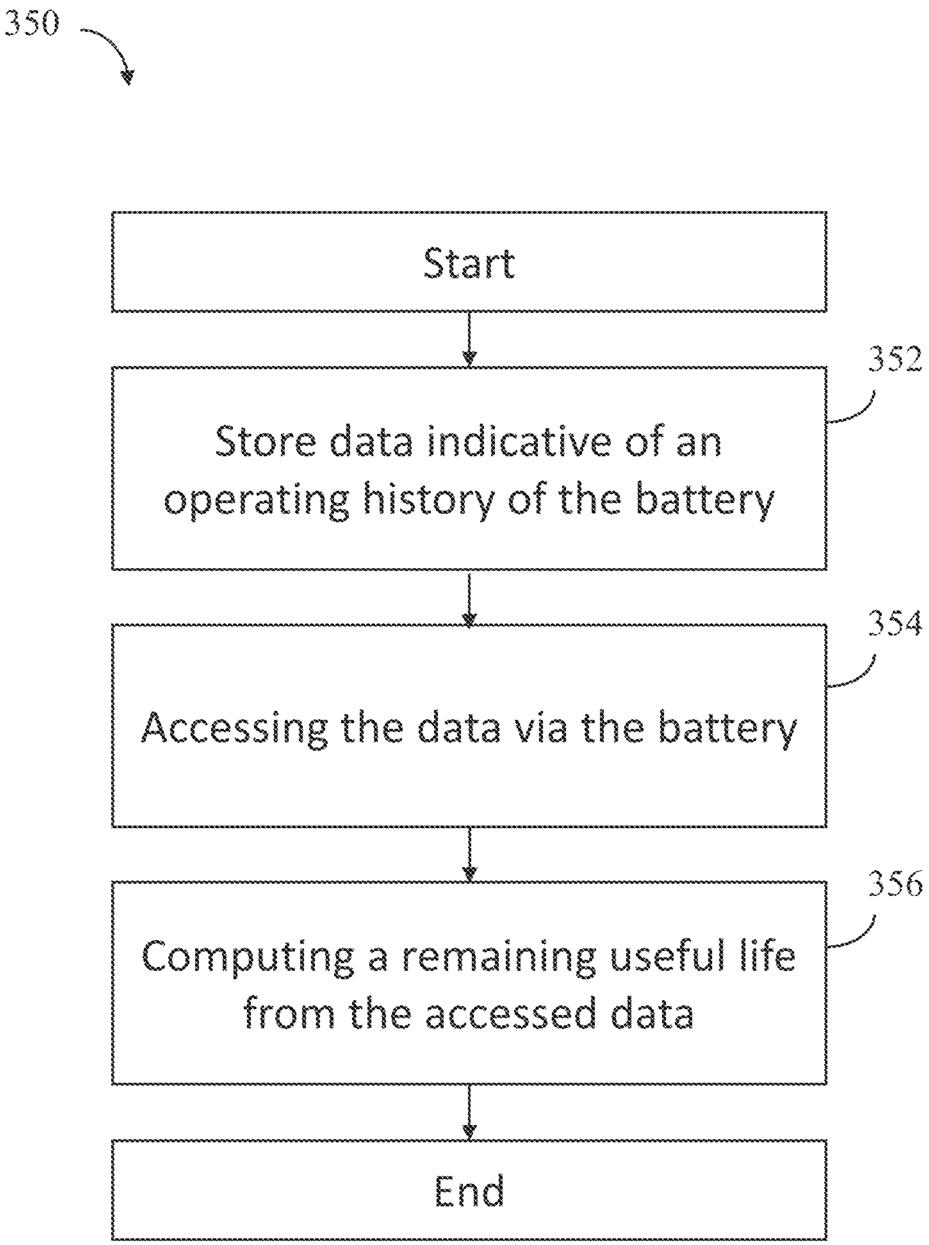
FIG. 3C illustrates a flowchart of method 350 for determining the remaining useful life of a battery, in accordance with some embodiments described herein.

FIG. 3C illustrates a flowchart of method 350 for determining the remaining useful life of a battery, in accordance with some embodiments. Prior to the start of method 350, a battery monitoring unit may collect raw data indicative of the operating conditions of the battery. The battery monitoring unit may further process the raw data into processed data. In some embodiments, the processed data may include maximum and minimum values of the voltages and temperatures measured by the battery monitoring unit during a battery cycle.

Method 350 may begin at block 352 by storing data indicative of an operating history of the battery. In some embodiments, the data is stored on the battery in a cryptographically secure manner. For example, the data indicative of the operating history of the battery may be stored as a blockchain in a distributed ledger on the battery. The battery monitoring unit may be a node of the distributed ledger such that the distributed ledger is stored in non-transitory memory included in the battery monitoring unit.

In some embodiments, storing the data indicative of the operating history of the battery as a blockchain includes transmitting pre-validation data from the battery monitoring unit to another node of the distributed ledger for validation and signing to the blockchain. Once validated, the signed blockchain that includes the data indicative of the operating history of the battery is transmitted to the nodes of the distributed ledger. Once received at the battery monitoring unit, the updated blockchain that includes the data indicative of the operating history of the battery is stored in the memory of the battery monitoring unit.

In some embodiments, the data indicative of the operating history of the battery may be processed data. The processed data may include maximum voltages, minimum voltages, maximum temperatures, minimum temperatures, timestamp corresponding to the start of the battery cycle, and timestamp correspond to the end of the battery cycle.

In some embodiments, the battery monitoring unit may function as a validator node. When functioning as a validator node, the battery monitoring unit may receive pre-validated data from another node of the distributed ledger. The battery monitoring unit may validate the received pre-validation data using a consensus process and/or checking if the parameters of the pre-validation data conform to the parameters of the distributed ledger, as described herein.

Next at block 354, the history of the battery is accessed via the battery. In some embodiments, the battery monitoring unit may access the history of the battery stored in non-transitory memory. In other embodiments, an external device may access the history of the battery by receiving the history of the battery stored in the battery monitoring unit. The history of the battery may be received from the non-transitory memory as a blockchain.

Next at block 356, the remaining useful life of the battery is computed based on the accessed data. In some embodiments, the battery monitoring unit may compute the remaining useful life. In other embodiments, an external device that receives the battery history from the battery monitoring unit may compute the remaining useful life.

In some embodiments, the remaining useful life may be computed by using a deep learning-based facility trained on historic operating data collected on similar batteries as those which include the battery monitoring unit. The deep learning-based facility may be trained to determine the remaining useful life of the battery using maximum voltages, minimum voltages, maximum temperatures, minimum temperatures, the duration of the battery cycle, number of cycles, and the type of each battery cycle in terms of whether charging or discharging.

The deep learning-based facility may determine a state of health of the battery to be used in the remaining useful life determination. In some embodiments, the deep learning-based facility may determine a state of health to less than or equal to 10%, less than or equal to 5%, or less than or equal to 2% of the battery's state of health.

Following the computing of the remaining useful life, method 350 ends. In some embodiments, following method 350, the computed remaining useful life may be stored in a cryptographically secure method such that a history of the remaining useful life may be tracked throughout the first and/or second life of the battery.

Additionally, or alternatively, the battery operating history may be accessed from a node of the distributed ledger. In some embodiments, each node of the distributed ledger may include a full copy of the distributed ledger. In other embodiments, nodes of the distributed ledger may include partial copies of the distributed ledger. The distributed ledger may include a data structure that organizes charging cycles into rows or columns of a table.

FIG. 4 illustrates an exemplary table of block data, in accordance with some embodiments. A first exemplary block and a second exemplary block are illustrated in table 400. Row one includes the labels for each column of the table. As reflected in row one, column one includes labels for the parameters stored in the blocks. Column two includes the bit width, reported in Bytes, for each row. Column three includes the block data for an $n^{th}$ block on the blockchain. Column four includes the block data for the $n+1^{th}$ block on the blockchain. Although illustrated as being stored in a table, the data may be stored in other data structures that preserve the grouping of data by cycle, as aspects of the technology described herein is not limited in this regard.

Row two includes the cycle type of the data stored in a block. For example, battery charges may be grouped by charging or discharging cycles. As shown in FIG. 4, column 3 includes the data for a discharging cycle and column four includes the data for a charging cycle. The charging cycle may be stored using a non-transitory memory allocation of a single Byte.

Row three includes the cycle number of the battery cycle. For example, columns may be ordered sequentially by cycle number with each block corresponding to a single charging or discharging cycle. The cycle number may be stored using a non-transitory memory allocation of 2 Bytes. In other embodiments, a single battery cycle may include both discharging and charging data.

Row four and row five include timestamps corresponding to the start and end of the battery cycle, respectively. Each time stamp includes day, month, year, hour, and minute values. The timestamps may be stored using a non-transitory memory allocation of 4 Bytes. In other embodiments, different time formats may be used which, in some aspects, may be stored using a larger or smaller memory allocation.

Row six and row seven include maximum and minimum cell voltages processed from the raw data collected by the battery monitoring unit. In some embodiments, the maximum cell voltages may include the twelve largest cell voltages measured during the battery cycle. The minimum cell voltages may include the twelve smallest cell voltages measured during the battery cycle. The maximum and minimum cell voltages may each be stored using a non-transitory memory allocation of 2 Bytes. Therefore, twelve minimum cell voltages may be stored using a total of 24 Bytes.

In other embodiments, the number of maximum and/or minimum cell voltages may be stored using a different number of cell voltages based on the desired memory allocation and/or based on a desired precision for the remaining useful life determination. To increase the precision of the remaining useful life determinations, additional maximum and/or minimum voltages may be included. For example, less than or equal to 12, less than or equal to 24, less than or equal to 48, or less than or equal to 100 maximum and/or minimum voltages may be included.

In yet other embodiments, to decrease the allocation of memory used to store blocks, fewer cell voltages may be used. For example, less than or equal to 12, less than or equal to 6, or less than or equal to 3 cell voltages may be included.

Additionally, or alternatively, other numbers of digits may be stored for each voltage value. For example, rather than using 2 Bytes, which may be used to store 16-bit data, 1 Byte or 4 Bytes may be used to store the data using 8-bit data or 32-bit data, respectively. In this way, the number of significant digits of the stored voltage data may be different according to different aspects of the technology described herein.

Row eight and row nine include maximum and minimum temperatures processed from the raw data collected by the battery monitoring unit. In some embodiments, the maximum cell temperature may include the twelve largest cell temperatures measured during the battery cycle. The minimum cell temperatures may include the twelve smallest cell temperatures measured during the battery cycle. The maximum and minimum cell temperatures may each be stored using a non-transitory memory allocation of 2 Bytes. Therefore, twelve maximum cell temperatures may be stored using a total of 24 Bytes and twelve minimum cell temperatures may be stored using a total of 24 Bytes. In other embodiments, the other numbers of stored temperature values based on the desired precision and/or memory allocation, as described herein.

Row ten includes a cryptographic hash, in accordance with some embodiments. The cryptographic hash may be generated, at least in part using the data stored in rows 2-9 of the respective block. Additionally, or alternatively, the cryptographic hash may be generated using a device ID associated with the battery.

Row eleven illustrates the total size of the non-transitory memory allocation of each block, in accordance with some embodiments. The total non-transitory memory allocation of each block may be 140 Bytes.

Figure 5:
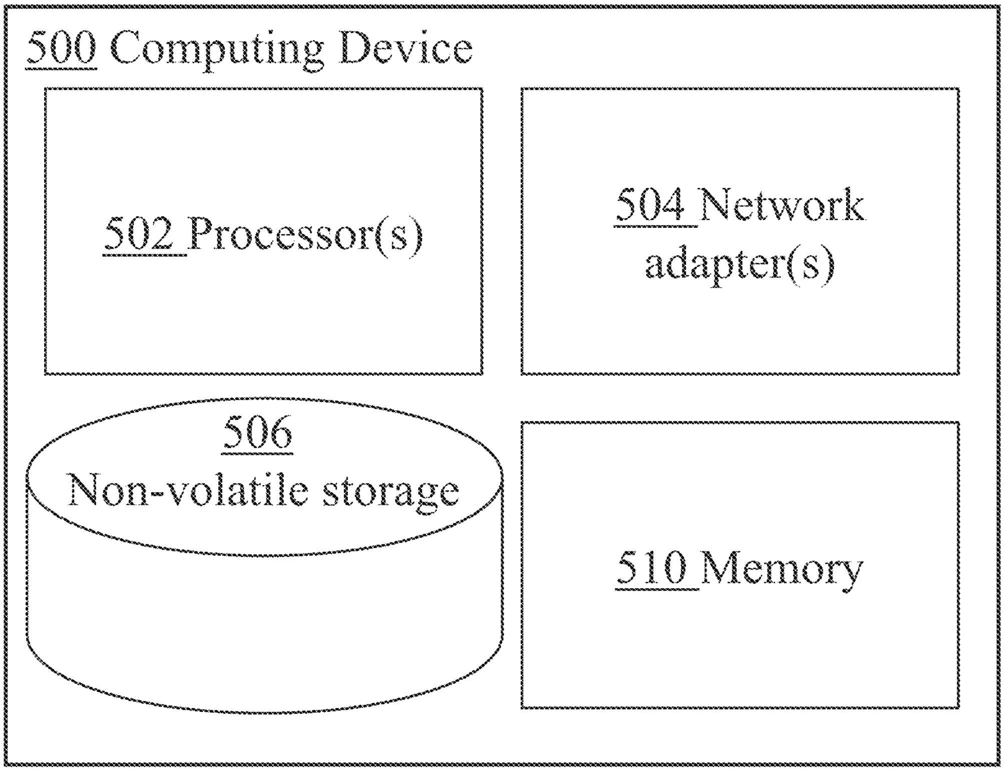
FIG. 5 illustrates one example implementation of a computing device in accordance with some embodiments described herein.

FIG. 5 illustrates one example implementation of a computing device in the form of computing device 500 that may be used in a system implementing techniques described herein. Alternative computing devices have more or fewer than those illustrated may be used in a system implement techniques describe herein, according to alternative embodiments.

Computing device 500 may include at least one processor 502, a network adapter 504, and a non-volatile computer-readable storage media 506. Computing device 500 may be, for example a desktop or laptop personal computer, a personal digital assistant, a smart mobile phone, a computing module integrated into a battery, or any other suitable computing device. Network adapter 504 may be any suitable hardware and/or software to enable the computing device 500 to communicate through wired and/or wireless connections with any other suitable computing device over any suitable computing network and using any suitable networking protocol, as described herein. The computing network may include switches, routers, gateways, access points, and/or other networking equipment as well as any suitable wired and/or wireless communication medium or media for exchanging data between two or more computers, including the Internet. Non-volatile computer readable storage media 506 may be adapted to store data to be processed and/or instructions to be executed by processor 502. Processor 502 processes data and/or executes instructions or controls such functions. The data instructions may be stored on the computer-readable storage media 506. The processor 502 may control writing data to and reading data from the non-volatile computer-readable storage media 506 and memory 510 in any suitable manner, as aspects of the disclosure provided herein are not limited in this respect.

The data and instructions stored on computer-readable storage media 506 may include computer-executable instructions implementing techniques which operate according to the techniques described herein. In the example of FIG. 5, non-volatile computer-readable storage media 506 stores computer-executable instructions implementing various facilities and storing various information as described above. Non-volatile computer-readable storage media 506 may store a battery monitoring and/or validation facility, in accordance with some embodiments described herein.

While not illustrated in FIG. 5, a computing device may additionally have one or more components and/or peripherals, including input and output devices. These devices can be used, among other things to present a user interface. Examples, of output devices that can be used to provide a user interface include printers or display screens for visual presentation of output and speakers or other sound generating devices for audible presentation of output. Examples of input devices that can be used for a user interface include keyboards, and pointing devices, such as mice touch pads, and digitizing tablets. As another example, a computing device may receive input information through speech recognition or in other audible format.

The methods described herein may be implemented in various suitable manners. The processing and decision blocks of the flowcharts above represent steps and acts that may be included in algorithms that carry out these various processes. Algorithms derived from these processes may be implemented as software integrated with and directing the operation of one or more single or multipurpose processors, may be implemented as functionally-equivalent circuits such as a Digital Signal Processing (DSP) circuit or an Application-Specific Integrated Circuit (ASIC), or may be implemented in any other suitable manner. It should be appreciated that the flowcharts included herein do not depict the syntax or operation of any particular apparatus carrying out the types of techniques described herein. It should also be appreciated that, unless otherwise indicated herein, the particular sequence of steps and/or acts described in each flowchart is merely illustrative of the algorithms that may be implemented and can be varied in implementations and embodiments of the principles described herein.

In some embodiments, an apparatus for monitoring operational conditions of a battery during use is provided, the apparatus comprising: electrodes configured to measure an output voltage of the battery; a thermometer configured to measure a temperature associated with the battery; and at least one non-transitory computer-readable storage medium encoded with a plurality of computer-executable instructions that, when executed, perform a method for predicting remaining useful life of a battery, the method comprising: storing on the battery data indicative of an operating history of the battery, wherein the data for each battery cycle is stored using a fixed allocation of memory; accessing the data via the battery; and computing a remaining useful life from the accessed data.

In some embodiments, the computer-executable instructions, when executed, perform a method further comprising: processing raw data, measured during the operation of a battery, to generate data indicative of the operating conditions of the battery, wherein the data for each battery cycle is stored using a fixed allocation of memory; generating a cryptographic hash based at least in part on the data; and transmitting pre-validation data using a battery monitoring unit attached to the battery.

In some embodiments, the computer-executable instructions when executed, perform a method further comprising: receiving, at a validation node, the pre-validation data of a fixed allocation of memory based at least in part on data that is indicative of the operating conditions of a first battery; validating the pre-validation data to generate a validated data block; and upon validation of a data block, transmitting the validated data block to a consensus node.

All definitions, as defined and used herein, should be understood to control over dictionary definitions, definitions in documents incorporated by reference, and/or ordinary meanings of the defined terms.

Embodiments have been described where the techniques are implemented in circuitry and/or computer-executable instructions. It should be appreciated that some embodiments may be in the form of a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Accordingly, in some embodiments, the techniques described herein may be embodied in computer-executable instructions implemented as software, including as application software, system software, firmware, middleware, embedded code, or any other suitable type of computer code. Such computer-executable instructions may be written using any of a number of suitable programming languages and/or programming or scripting tools, and also may be compiled as executable machine language code or intermediate code that is executed on a framework or virtual machine.

When techniques described herein are embodied as computer-executable instructions, these computer-executable instructions may be implemented in any suitable manner, including as a number of functional facilities, each providing one or more operations to complete execution of algorithms operating according to these techniques. A "functional facility," however instantiated, is a structural component of a computer system that, when integrated with and executed by one or more computers, causes the one or more computers to perform a specific operational role. A functional facility may be a portion of or an entire software element. For example, a functional facility may be implemented as a function of a process, or as a discrete process, or as any other suitable unit of processing. If techniques described herein are implemented as multiple functional facilities, each functional facility may be implemented in its own way; all need not be implemented the same way. Additionally, these functional facilities may be executed in parallel and/or serially, as appropriate, and may pass information between one another using a shared memory on the computer(s) on which they are executing, using a message passing protocol, or in any other suitable way.

Generally, functional facilities include routines, programs, objects, components, data structures, etc. that perform particular tasks or implement particular abstract data types. Typically, the functionality of the functional facilities may be combined or distributed as desired in the systems in which they operate. In some implementations, one or more functional facilities carrying out techniques herein may together form a complete software package. These functional facilities may, in alternative embodiments, be adapted to interact with other, unrelated functional facilities and/or processes, to implement a software program application.

Some exemplary functional facilities have been described herein for carrying out one or more tasks. It should be appreciated, though, that the functional facilities and division of tasks described is merely illustrative of the type of functional facilities that may be implemented using the exemplary techniques described herein, and that embodiments are not limited to being implemented in any specific number, division, or type of functional facilities. In some implementations, all functionalities may be implemented in a single functional facility. It should also be appreciated that, in some implementations, some of the functional facilities described herein may be implemented together with or separately from others (i.e., as a single unit or separate units), or some of these functional facilities may not be implemented.

Computer-executable instructions implementing the techniques described herein (when implemented as one or more functional facilities or in any other manner) may, in some embodiments, be encoded on one or more computer-readable media to provide functionality to the media. Computer-readable media include magnetic media such as a hard disk drive, optical media such as a Compact Disk (CD) or a Digital Versatile Disk (DVD), a persistent or non-persistent solid-state memory (e.g., Flash memory, Magnetic RAM, etc.), or any other suitable storage media. Such a computer-readable medium may be implemented in any suitable manner. As used herein, "computer-readable media" (also called "computer-readable storage media") refers to tangible storage media. Tangible storage media are non-transitory and have at least one physical, structural component. In a "computer-readable medium," as used herein, at least one physical, structural component has at least one physical property that may be altered in some way during a process of creating the medium with embedded information, a process of recording information thereon, or any other process of encoding the medium with information. For example, a magnetization state of a portion of a physical structure of a computer-readable medium may be altered during a recording process.

Further, some techniques described above comprise acts of storing information (e.g., data and/or instructions) in certain ways for use by these techniques. In some implementations of these techniques—such as implementations where the techniques are implemented as computer-executable instructions—the information may be encoded on a computer-readable storage media. Where specific structures are described herein as advantageous formats in which to store this information, these structures may be used to impart a physical organization of the information when encoded on the storage medium. These advantageous structures may then provide functionality to the storage medium by affecting operations of one or more processors interacting with the information; for example, by increasing the efficiency of computer operations performed by the processor(s).

In some, but not all, implementations in which the techniques may be embodied as computer-executable instructions, these instructions may be executed on one or more suitable computing device(s) operating in any suitable computer system, or one or more computing devices (or one or more processors of one or more computing devices) may be programmed to execute the computer-executable instructions. A computing device or processor may be programmed to execute instructions when the instructions are stored in a manner accessible to the computing device or processor, such as in a data store (e.g., an on-chip cache or instruction register, a computer-readable storage medium accessible via a bus, a computer-readable storage medium accessible via one or more networks and accessible by the device/processor, etc.). Functional facilities comprising these computer-executable instructions may be integrated with and direct the operation of a single multi-purpose programmable digital computing device, a coordinated system of two or more multi-purpose computing device sharing processing power and jointly carrying out the techniques described herein, a single computing device or coordinated system of computing devices (co-located or geographically distributed) dedicated to executing the techniques described herein, one or more Field-Programmable Gate Arrays (FPGAs) for carrying out the techniques described herein, or any other suitable system.

Embodiments have been described where the techniques are implemented in circuitry and/or computer-executable instructions. It should be appreciated that some embodiments may be in the form of a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects describe in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A method of predicting remaining useful life of a battery, comprising:

storing, in memory on the battery, data indicative of an order of operating conditions of the battery produced from a plurality of battery cycles, wherein the data is stored in per-cycle data records corresponding to the plurality of battery cycles, wherein a per-cycle data record corresponding to a respective battery cycle is maintained in a fixed allocation of the memory, and the per-cycle data record corresponding to the respective battery cycle comprises:

an identifier indicating a type of the respective battery cycle as a charge cycle or a discharge cycle;

a timestamp associated with the respective battery cycle, and a plurality of operating conditions associated with the battery in correspondence with the respective battery cycle, wherein the operating conditions include per-cycle measurements of at least one of a maximum voltage value, a minimum voltage value, a maximum temperature value, and a minimum temperature value for the respective battery cycle;

accessing the data via the battery; and computing a remaining useful life from the accessed data based on the order of the operating conditions, wherein the computing of the remaining useful life includes a calculation that evaluates a sequence of the per-cycle data records that store the operating conditions that the battery was operated in, and wherein the calculation further evaluates the per-cycle data records to identify measurements of the operating conditions experienced by the battery during respective battery cycles, in correspondence with whether the battery is charging or discharging.

2. The method of claim 1, wherein storing the data indicative of an operating history of the battery comprises cryptographically storing the data on the battery.

3. The method of claim 2, wherein storing the data indicative of an operating history of the battery comprises adding data records to a blockchain.

4. The method of claim 2, further comprising signing a blockchain storing the data.

5. The method of claim 4, wherein signing the blockchain storing the data comprises transmitting pre-validation data to a node of a distributed ledger.

6. The method of claim 5, wherein a validation of the pre-validation data comprises providing a proof of stake.

7. The method of claim 5, wherein a validation of the pre-validation data comprises providing a proof of work.

8. The method of claim 5, wherein the node of the distributed ledger is a battery monitoring unit configured to store a copy of the distributed ledger with the battery as part of a battery module.

9. The method of claim 1, wherein the computing of the remaining useful life further evaluates a number of times that the battery was operated in a respective condition of the operating conditions.

10. The method of claim 1, wherein maximum and minimum values of voltage or temperature are determined with the operating conditions stored for each battery cycle of the plurality of battery cycles.

11. A method of transmitting remaining useful life data for cryptographic validation, the method comprising:

processing raw data, measured during operation of a battery, to generate data indicative of an order of operating conditions of the battery produced from a plurality of battery cycles, wherein the data is stored in per-cycle data records corresponding to the plurality of battery cycles, wherein a per-cycle data record corresponding to a respective battery cycle is maintained in a fixed allocation of memory, and wherein the per-cycle data record corresponding to the respective battery cycle comprises:

an identifier indicating a type of the respective battery cycle as a charge cycle or a discharge cycle;

a timestamp associated with the respective battery cycle, and a plurality of operating conditions associated with the battery in correspondence with the respective battery cycle, wherein the operating conditions include per-cycle measurements of at least one of a maximum voltage value, a minimum voltage value, a maximum temperature value, and a minimum temperature value for the respective battery cycle;

generating a cryptographic hash based at least in part on the data; and transmitting pre-validation data using a battery monitoring unit attached to the battery, wherein the pre-validation data provides information that enables another device to compute a remaining useful life of the battery based on a calculation that evaluates a sequence of the per-cycle data records that store the operating conditions that the battery was operated in, and wherein the calculation further evaluates the per-cycle data records to identify measurements of the operating conditions experienced by the battery during respective battery cycles, in correspondence with whether the battery is charging or discharging.

12. The method of claim 11, wherein the pre-validation data comprises the cryptographic hash.

13. The method of claim 11, wherein the pre-validation data comprises:

the data indicative of the operating conditions of the battery for a battery cycle; and the cryptographic hash.

14. A method of validating pre-validation data, the method comprising:

receiving, at a validation node, the pre-validation data of a fixed allocation of memory based at least in part on a per-cycle data record that is indicative of operating conditions for a respective battery cycle of a first battery, wherein the per-cycle data record corresponding to the respective battery cycle comprises:

an identifier indicating a type of the respective battery cycle as a charge cycle or a discharge cycle;

a timestamp associated with the respective battery cycle, and a plurality of operating conditions associated with the first battery in correspondence with the respective battery cycle, wherein the operating conditions include per-cycle measurements of at least one of a maximum voltage value, a minimum voltage value, a maximum temperature value, and a minimum temperature value for the respective battery cycle;

validating the pre-validation data to generate a validated data block;

upon validation of a data block, generating a blockchain that includes the validated data block; and transmitting the blockchain to nodes of a distributed ledger, wherein the distributed ledger provides information that enables another device to compute a remaining useful life of the first battery based on a calculation that evaluates a sequence of per-cycle data records, produced from a plurality of battery cycles of the first battery, that store the operating conditions that the first battery was operated in, and wherein the calculation further evaluates the per-cycle data records to identify measurements of the operating conditions experienced by the first battery during respective battery cycles, in correspondence with whether the first battery is charging or discharging.

15. The method of claim 14, wherein the validation node stores an instance of the distributed ledger of battery life transactions.

16. The method of claim 14, wherein the validation node does not store an instance of the distributed ledger of battery life transactions.

17. The method of claim 14, wherein the validation node is a battery monitoring unit attached to a second battery, wherein the second battery is separate from the first battery.

18. The method of claim 14, wherein the validation node is a computing node that is not attached to a battery.

19. The method of claim 14, wherein the validation node is a node that is associated with a stake in the blockchain.

20. The method of claim 14, wherein the validation node is a node that provides a proof of work by generating a cryptographic hash.

* * * * *